(12) United States Patent
Kachi et al.

(10) Patent No.: US 10,811,511 B2
(45) Date of Patent: Oct. 20, 2020

(54) METHOD OF MANUFACTURING SEMICONDUCTOR DEVICE

(71) Applicant: Mitsubishi Electric Corporation, Tokyo (JP)

(72) Inventors: Takao Kachi, Tokyo (JP); Yasuhiro Yoshiura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/315,067

(22) PCT Filed: Aug. 25, 2016

(86) PCT No.: PCT/JP2016/074741
§ 371 (c)(1),
(2) Date: Jan. 3, 2019

(87) PCT Pub. No.: WO2018/037522
PCT Pub. Date: Mar. 1, 2018

(65) Prior Publication Data
US 2019/0319109 A1    Oct. 17, 2019

(51) Int. Cl.
*H01L 21/02* (2006.01)
*H01L 29/66* (2006.01)
(Continued)

(52) U.S. Cl.
CPC .. *H01L 29/66136* (2013.01); *H01L 21/02532* (2013.01); *H01L 21/283* (2013.01);
(Continued)

(58) Field of Classification Search
CPC ................................................ H01L 21/02532
See application file for complete search history.

(56) References Cited

U.S. PATENT DOCUMENTS

| 5,777,920 A | 7/1998 | Ishigaki et al. |
| 5,856,707 A * | 1/1999 | Sardella ............... H01L 23/5226 257/751 |

FOREIGN PATENT DOCUMENTS

| JP | H06-163910 A | 6/1994 |
| JP | H09-162361 A | 6/1997 |

(Continued)

OTHER PUBLICATIONS

International Search Report issued in PCT/JP2016/074741; dated Sep. 27, 2016.

(Continued)

*Primary Examiner* — Peniel M Gumedzoe
*Assistant Examiner* — Christopher A Johnson
(74) *Attorney, Agent, or Firm* — Studebaker & Brackett PC

(57) ABSTRACT

It is an object of the present invention to easily perform an electric characteristic test for ensuring quality of a semiconductor device on an electrode pattern defect or deficiency. A method of manufacturing a semiconductor device according to the present invention performs, a first etching having a higher selected ratio with respect to a semiconductor material of a first semiconductor layer than a material of a first electrode film over the first electrode film, and removes a region in the first semiconductor layer below a pattern defective part or a deficiency part of the first electrode film at least partially to form an electrode film in the pattern defective part or the deficiency part of the first electrode film.

12 Claims, 6 Drawing Sheets

(51) Int. Cl.
   *H01L 21/283*    (2006.01)
   *H01L 21/306*    (2006.01)
   *H01L 21/3213*   (2006.01)
   *H01L 29/06*     (2006.01)

(52) U.S. Cl.
   CPC .. *H01L 21/30604* (2013.01); *H01L 21/32133* (2013.01); *H01L 29/0634* (2013.01)

(56) References Cited

FOREIGN PATENT DOCUMENTS

| JP | 2000-174083 A | 6/2000 |
| JP | 2011-009768 A | 1/2011 |

OTHER PUBLICATIONS

An Office Action mailed by the Japanese Patent Office dated Dec. 17, 2019, which corresponds to Japanese Patent Application No. 2018-535996 and is related to U.S. Appl. No. 16/315,067.

* cited by examiner

F I G. 3
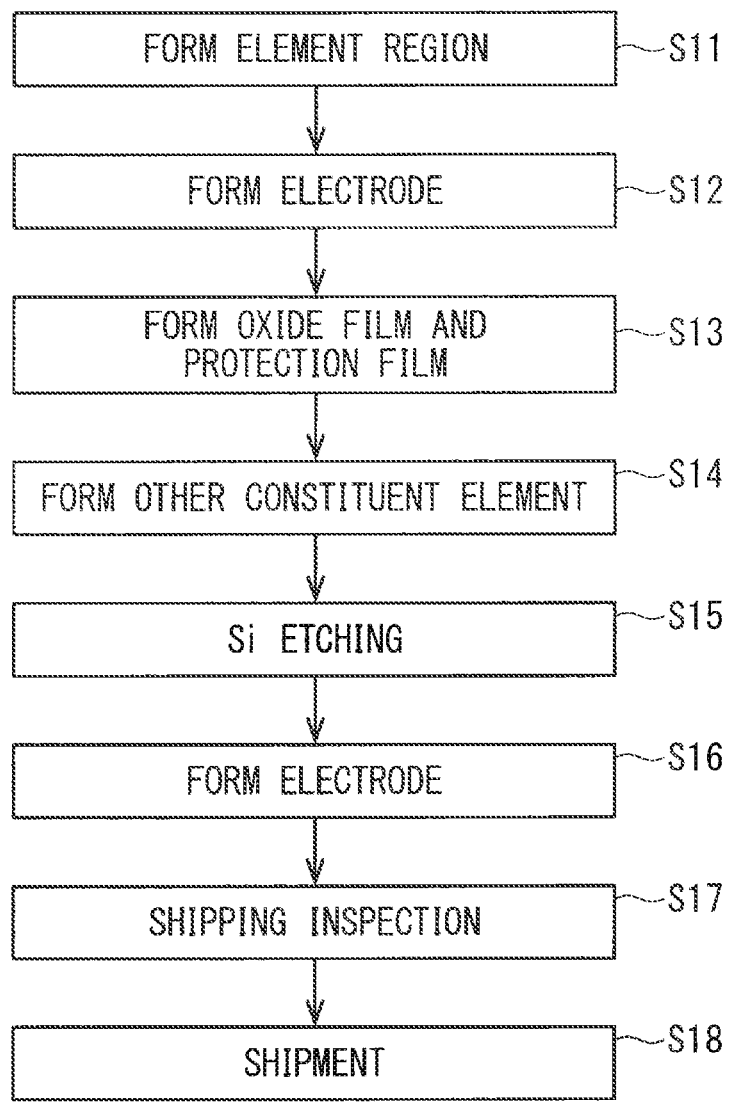

F I G. 10
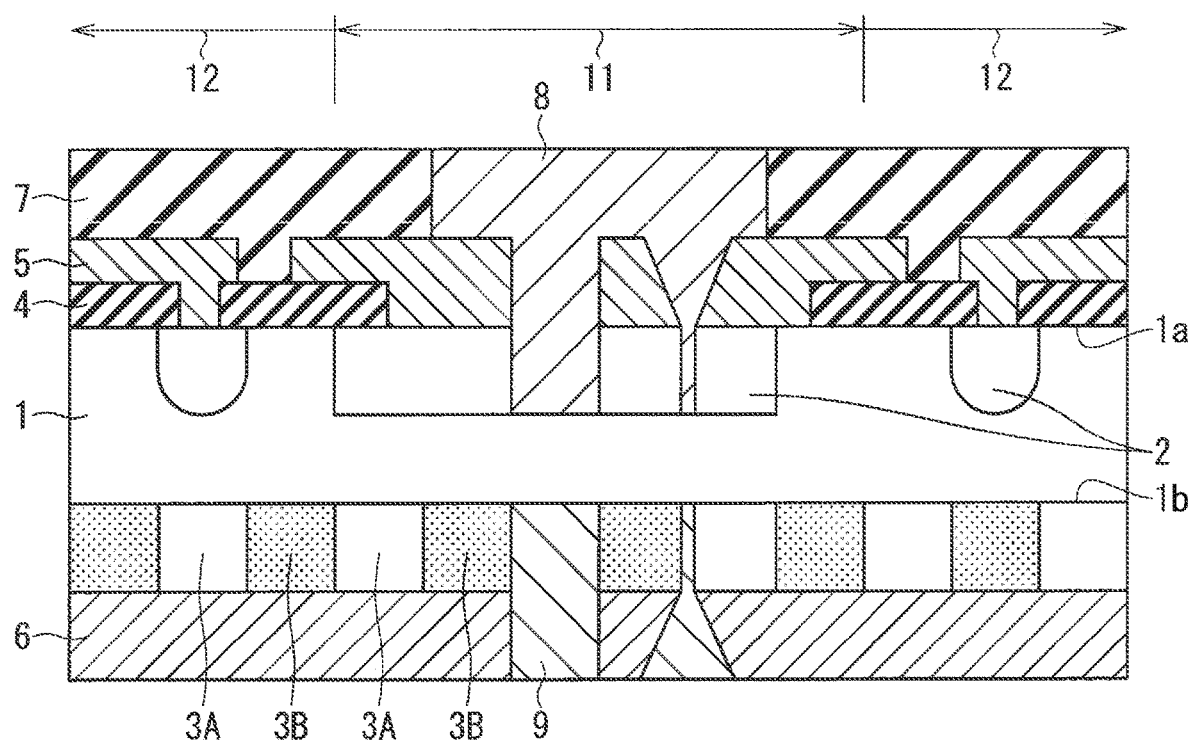

METHOD OF MANUFACTURING SEMICONDUCTOR DEVICE

TECHNICAL FIELD

The present invention relates an electrode pattern defect or an electrode deficiency of a semiconductor device.

BACKGROUND ART

In a power semiconductor chip, a metal film is used as an electrode formed to be in contact with a semiconductor layer of an element region (Patent Document 1, for example). In a process of manufacturing the power semiconductor chip, a defect occurs in an electrode pattern and an electrode deficiency occurs after forming the electrode in some cases, and it is extremely hard to prevent these problems.

Accordingly, an electric characteristic test is performed to ensure quality or electric characteristics of the power semiconductor chip.

PRIOR ART DOCUMENTS

Patent Documents

Patent Document 1: Japanese Patent Application Laid-Open No. 2011-009768

SUMMARY

Problem to be Solved by the Invention

In an alternating current characteristic test (AC test) which is one example of the electric characteristic test, a current or a voltage application condition needs to be set with consideration for a condition that a current or an electrical field is concentrated into a part of pattern defect or electrode deficiency and a non-defective item is not damaged by the test. Such a current or voltage application condition should be set in accordance with a size or a degree of the electrode pattern defect or the electrode deficiency. However, the electrode pattern defect or the electrode deficiency accidentally occurs, and its size or the degree cannot be controlled, so that a great amount of effort is required to set the current or the voltage application condition, and a large amount of time is required to perform the test.

The present invention is therefore has been made to solve the above problems, and it is an object of the present invention to easily perform an electric characteristic test for ensuring quality of a semiconductor device on an electrode pattern defect or deficiency.

Means to Solve the Problem

A method of manufacturing a semiconductor device according to the present invention performs, on a semiconductor device having a semiconductor substrate, a first semiconductor layer being formed on a side of a first main surface of the semiconductor substrate, and a first electrode film being formed on the first semiconductor layer to be in contact with the first semiconductor layer, a first etching having a higher selected ratio with respect to a semiconductor material of the first semiconductor layer than a material of the first electrode film over the first electrode film, and removes a region in the first semiconductor layer below a pattern defective part or a defective part of the first electrode film at least partially to form an electrode film in a region where the first semiconductor layer is removed by the first etching and on the first electrode film.

Effects of the Invention

A method of manufacturing a semiconductor device according to the present invention performs, on a semiconductor device having a semiconductor substrate, a first semiconductor layer being formed on a side of a first main surface of the semiconductor substrate, and a first electrode film being formed on the first semiconductor layer to be in contact with the first semiconductor layer, a first etching having a higher selected ratio with respect to a semiconductor material of the first semiconductor layer than a material of the first electrode film over the first electrode film, and removes a region in the first semiconductor layer below a pattern defective part or a deficiency part of the first electrode film at least partially to form an electrode film in a region where the first semiconductor layer is removed by the first etching and on the first electrode film. According to the method of manufacturing the semiconductor device according to the present invention, if the first electrode film includes a pattern defective part or a deficiency part, the first semiconductor layer located immediately below the pattern defective part or the deficiency part is removed by a predetermined amount of thickness. Accordingly, a thickness of the first semiconductor layer below the pattern defective part or the deficiency part of the first electrode film can be controlled, thus a test condition of an electric characteristic test can be easily set in accordance with the thickness of the first semiconductor layer, and the electric characteristic test can be easily performed.

These and other objects, features, aspects and advantages of the present invention will become more apparent from the following detailed description of the present invention when taken in conjunction with the accompanying drawings.

BRIEF DESCRIPTION OF DRAWINGS

FIG. 3 A flow chart showing a flow from a manufacture to a shipment of a semiconductor device according to an embodiment 1 of the present invention.

FIG. 10 A cross-sectional view of a semiconductor device according to a modification example of the present invention.

DESCRIPTION OF EMBODIMENT(S)

<Premise Technique>

Figure 1:
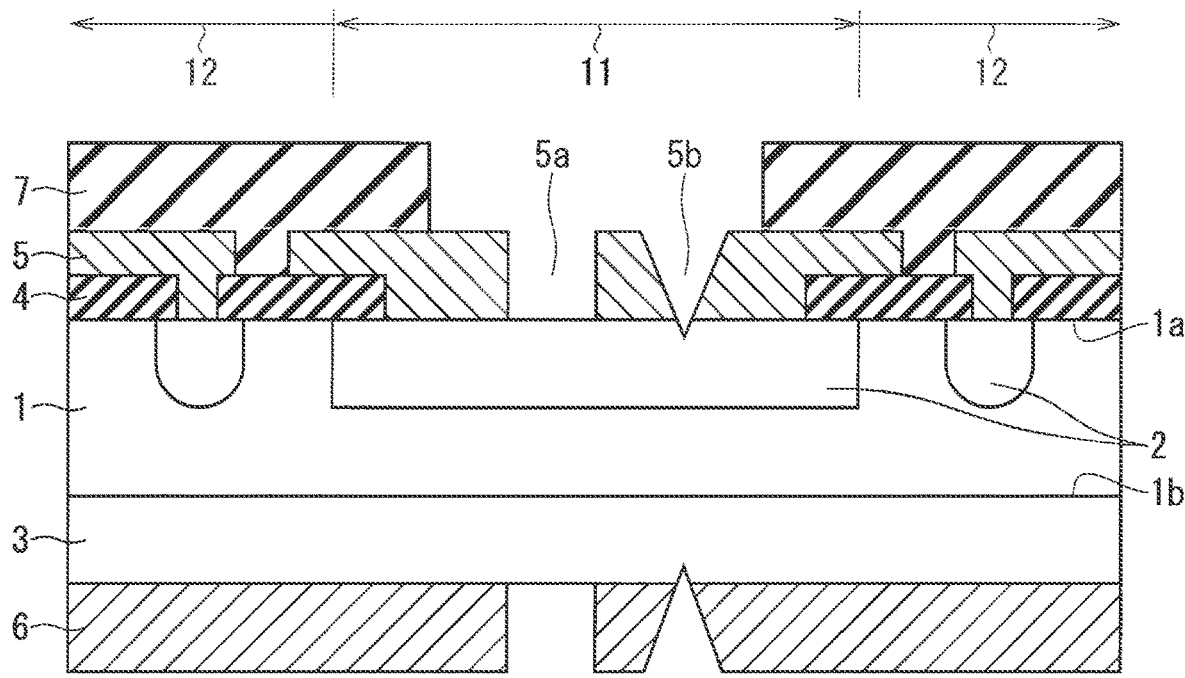
FIG. 1 A cross-sectional view of a semiconductor device according to a premise technique of the present invention.

FIG. 1 is a cross-sectional view of a semiconductor device according to a premise technique of the present invention. A configuration of a semiconductor device is described hereinafter. As shown in FIG. 1, in the semiconductor device, a P type Si layer 2, which is a second conductive type, is formed on a surface layer on a side of a first main surface 1a of an N type Si substrate 1, which is a first conductive type. In the present specification, the first conductivity type is an N type and the second conductivity type is a P type, however, those conductivity types may be reversed.

FIG. 1 is the cross-sectional view of the semiconductor device, and when the semiconductor device is viewed from an upper side of a paper sheet of FIG. 1, an element region 11 is located in a central part and a termination region 12 is located in a peripheral part of the semiconductor device surrounding the element region 11.

An oxide film 4 and an electrode film 5 are formed on an Si layer 3 to be in contact with the Si layer 2, and a protection film 7 is further formed to cover the oxide film 4 and the electrode film 5.

The N type Si layer 3 is formed on a second main surface 1b of the Si substrate 1 opposing the first main surface 1a. An electrode film 6 is formed on the Si layer 3.

Figure 2:
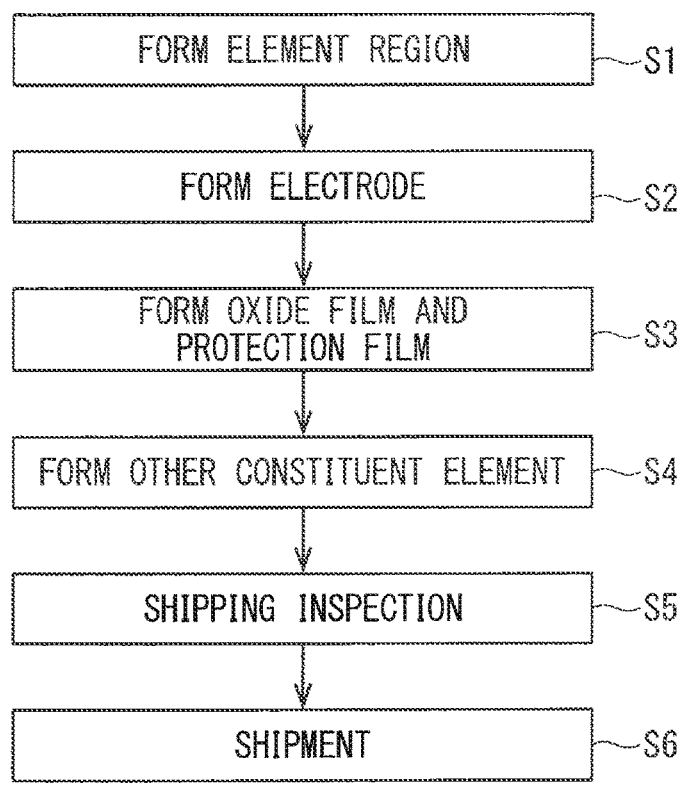
FIG. 2 A flow chart showing a flow from a manufacture to a shipment of the semiconductor device according to the premise technique of the present invention.

FIG. 2 is a flow chart from a manufacture to a shipment of a semiconductor device according to a premise technique of the present invention. A flow from the manufacture to the shipment of the semiconductor device is described along FIG. 2 hereinafter. Firstly, the P type Si layer 2 is formed on the side of the first main surface 1a of the N type Si substrate 1, and the element region 11 and the termination region 12 of the semiconductor device are formed (Step S1).

Next, the electrode film 5 is formed to be in contact with an upper surface of the P type Si layer 2 (Step S2), and subsequently, the oxide film 4 and the protection film 7 are formed on the Si substrate 1 (Step S3). The oxide film 4 may be formed prior to the electrode film 5.

Next, the other constituent element of the semiconductor device is formed (Step S4). Specifically, the N type Si layer 3 is formed on the side of the second main surface 1b of the Si substrate 1, and the electrode film 6 is formed to be in contact with the upper surface of the Si layer 3. However, in forming the electrode film 5 in Step S2, a part where the electrode film 5 is not formed due to a pattern defect, that is to say, a pattern defective part 5a occurs in some cases. A deficiency part 5b occurs during a formation of the other constituent elements after forming the electrode film 5 (Steps S3 and S4) in some cases. Similarly, a pattern defective part 6a and a deficiency part 6b may occur in the electrode film 6.

Accordingly, an electric characteristic test (Step S5) is implemented as a shipping inspection before the shipment (Step S6), however, a size of the pattern defective parts 5a and 6a or the deficiency parts 5b and 6b cannot be controlled, so that it is hard to set a test condition such as a current application condition or a voltage application condition in the electric characteristic test, and there is a problem that time and cost increase to perform the test.

Accordingly, in the present invention, the shipping inspection can be performed easily by adding a process immediately before the shipping inspection of the semiconductor device.

Embodiment 1

FIG. 3 is a flow chart from a manufacture to a shipment of a semiconductor device according to the embodiment 1 of the present invention. A flow from the manufacture to the shipment of the semiconductor device according to the embodiment 1 of the present invention is described along FIG. 3 hereinafter.

Firstly, in the manner similar to the premise technique of the present invention, the P type Si layer 2 is formed on the side of the first main surface 1a of the N type Si substrate 1, and the element region 11 and the termination region 12 of the semiconductor device are formed (Step S11). Next, the electrode film 5 is formed to be in contact with the upper surface of the P type Si layer 2 (Step S12). Next, the oxide film 4 and the protection film 7 are formed on the Si substrate 1 (Step S13), and subsequently, as the other constituent element, the N type Si layer 3 is formed on the side of the second main surface 1b of the Si substrate 1, and the electrode film 6 is formed to be in contact with the upper surface of the Si layer 3 (Step S14). The semiconductor device obtained in such a manner has a configuration similar to the semiconductor device shown in FIG. 1.

Figure 4:
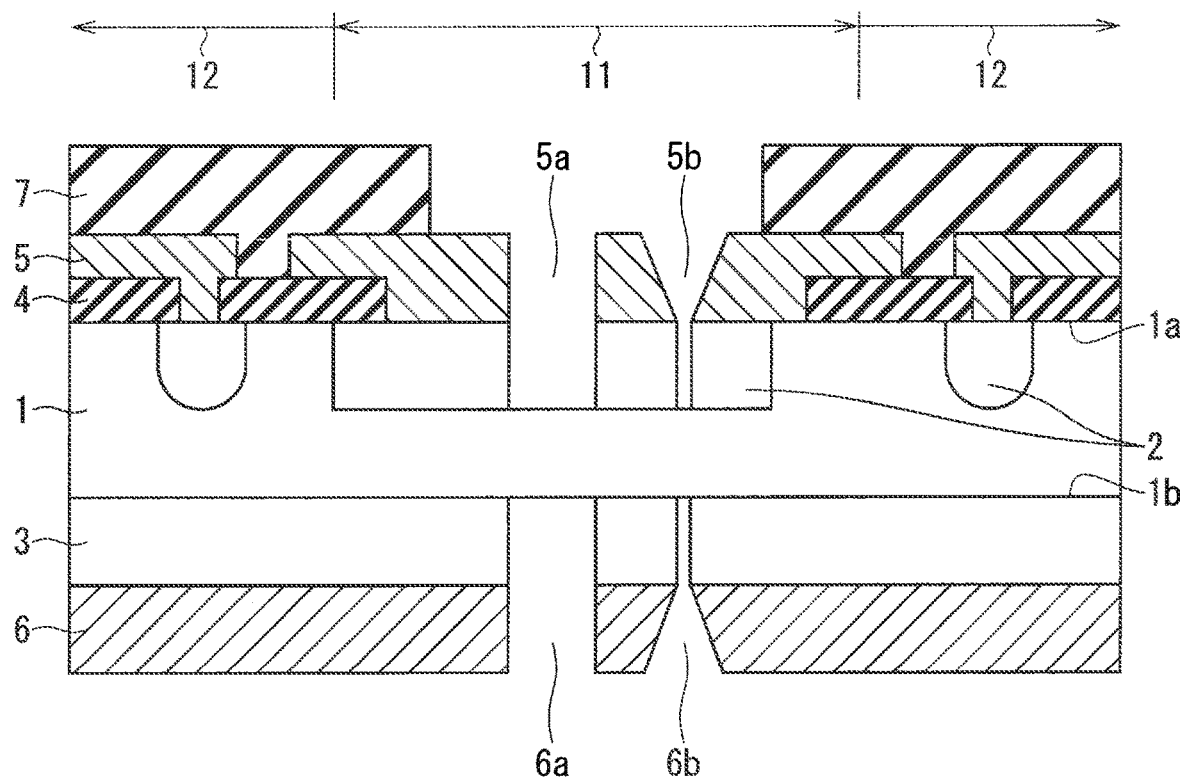
FIG. 4 A cross-sectional view of the semiconductor device in a stage of finishing Si etching process in the present invention.

Next, Si etching is performed over the electrode film 5 and the electrode film 6 (Step S15). FIG. 4 illustrates a cross-sectional view of the semiconductor device in a stage of finishing the Si etching process. The Si etching may be wet etching or dry etching. In FIG. 4, the Si substrate 1 and the Si layer 3 are exposed on right and left side surfaces of the semiconductor device, however, in performing the wet etching, a protection layer is formed on the side surfaces so that the Si substrate 1 and the Si layer 3 are not etched from the side surfaces. The Si etching preferably has as high a selected ratio as possible with respect to Si. That is to say, an etching speed with respect to Si is higher than an etching speed with respect to the electrode film 5, the oxide film 4, and the protection film 7. Accordingly, the Si layer 2 located below the pattern defective part 5a or the deficiency part 5b of the electrode film 5 is removed with a minimum influence on the electrode film 5, the oxide film 4, and the protection film 7 from the etching. In the similar manner, the Si layer 3 located below the pattern defective part 6a or the deficiency part 6b of the electrode film 6 is also removed.

Figure 5:
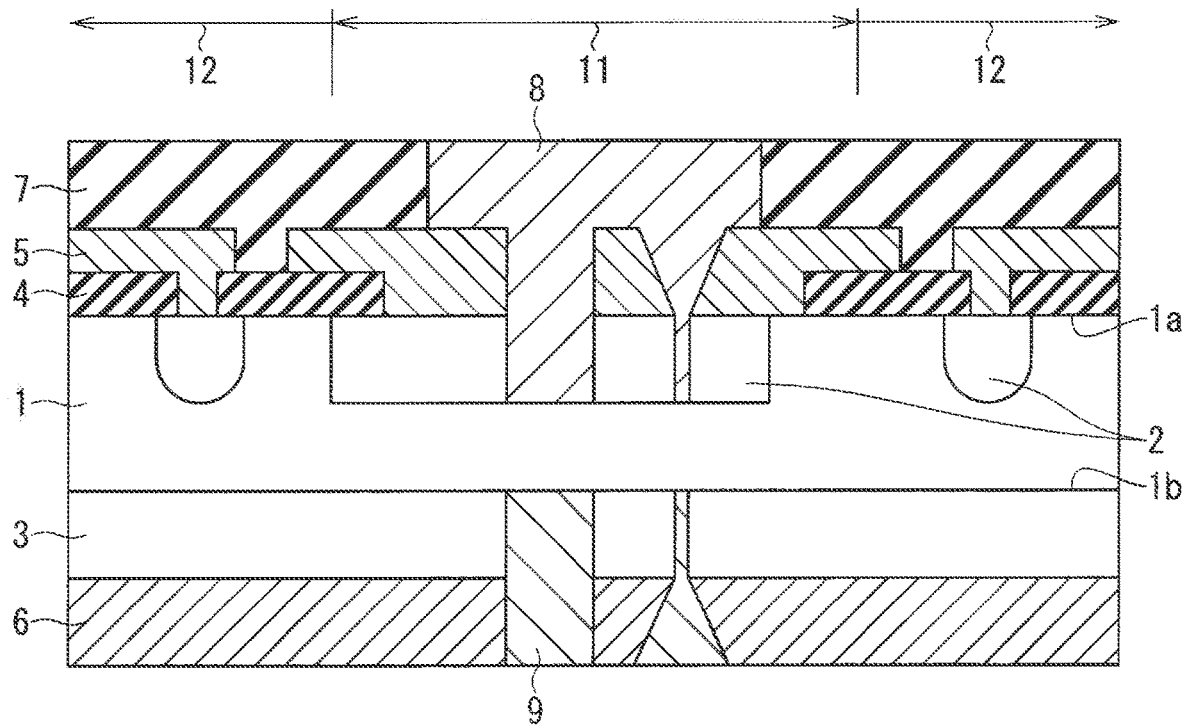
FIG. 5 A cross-sectional view of the semiconductor device in which an electrode formation process is finished in the present invention.

Next, an electrode film 8 is formed over the electrode film 5 and an electrode film 9 is formed over the electrode film 6 (Step S16). FIG. 5 illustrates a cross-sectional view of the semiconductor device in a stage of finishing the electrode forming process. A material of the electrode films 8 and 9 formed in the present process may be the same as or different from that of the electrodes 5 and 6 which have been already formed. Through this process, on the side of the first main surface 1a of the Si substrate 1, the electrode film 8 is formed in the pattern defective part 5a and the deficiency part 5b of the electrode film 5 and a part removed by the etching in the Si layer 2 immediately below the pattern defective part 5a and the deficiency part 5b. On the side of the second main surface 1b of the Si substrate 1, the electrode film 9 is formed in the pattern defective part 6a and the deficiency part 6b of the electrode film 6 and a part removed by the etching in the Si layer 3 immediately below the pattern defective part 6a and the deficiency part 6b. The process of manufacturing the semiconductor device according to the embodiment 1 of the present invention is finished.

Subsequently, a shipping inspection is performed on the semiconductor device (Step S17), and then the shipment if performed (Step S18).

Figure 6:
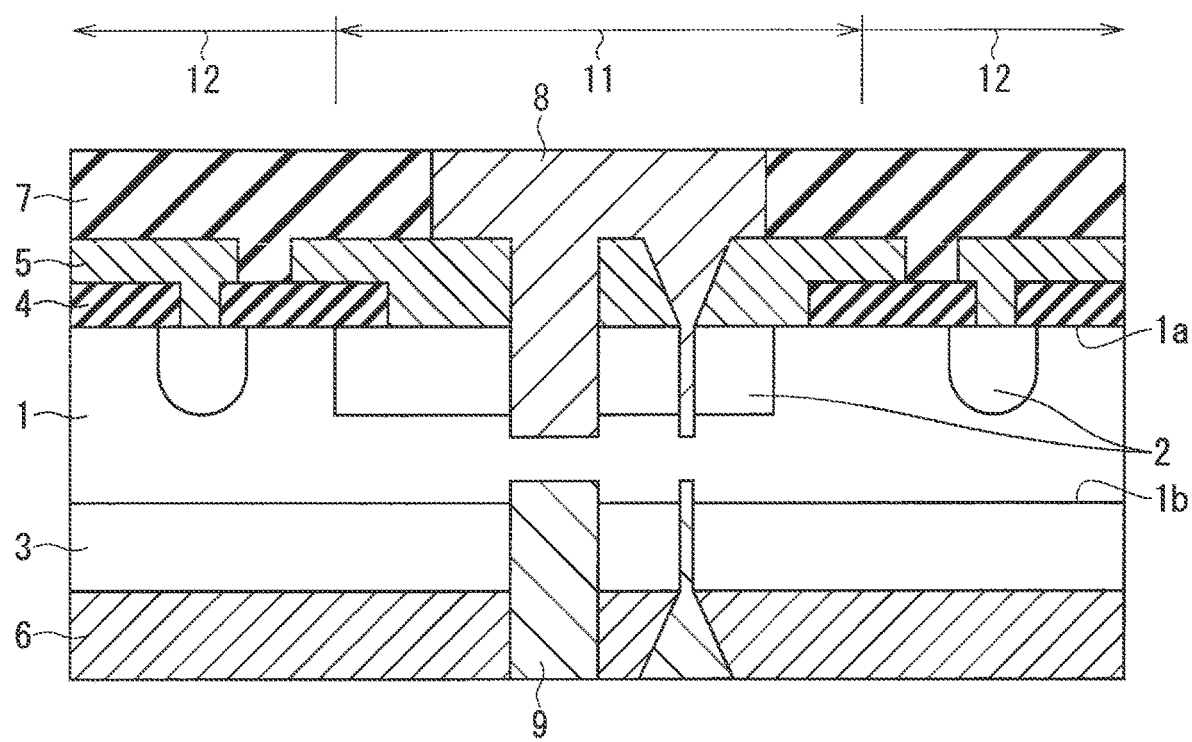
FIG. 6 A cross-sectional view of a semiconductor device according to a modification example of the present invention.
Figure 7:
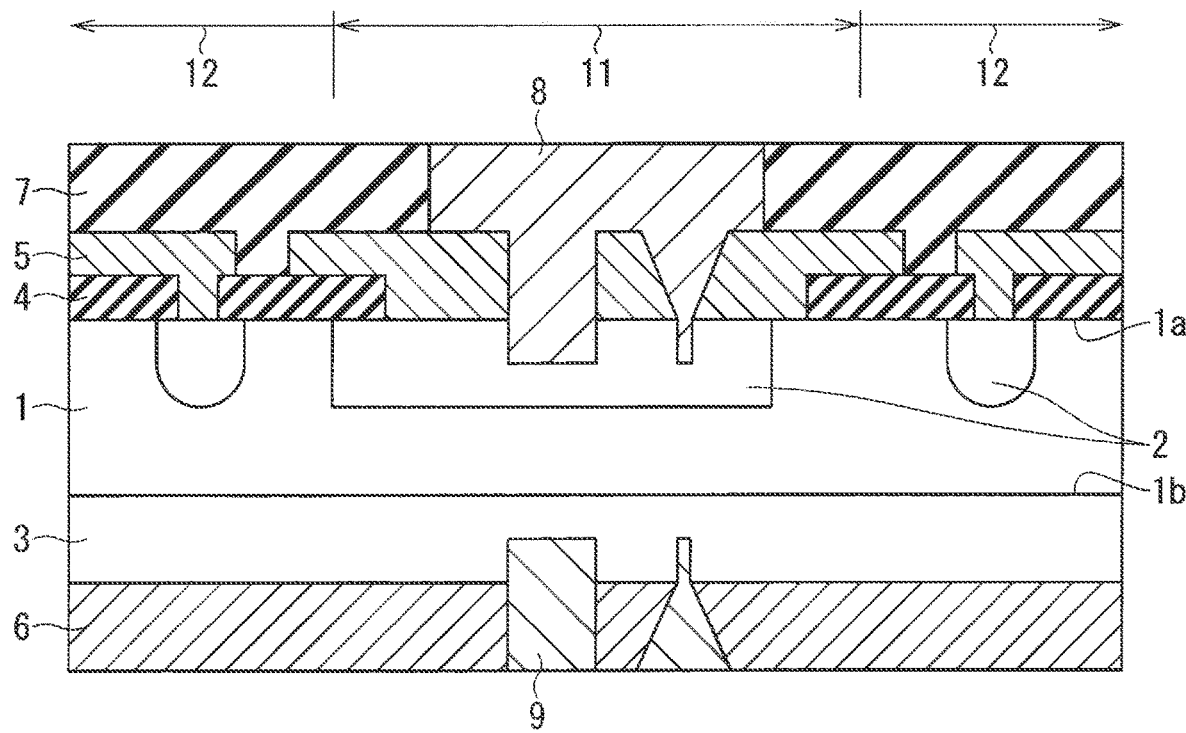
FIG. 7 A cross-sectional view of a semiconductor device according to a modification example of the present invention.

A modification example of the present invention is described below. In FIGS. 4 and 5, an etching amount of each of the Si layers 2 and 3 in the Si etching process is equal to a thickness of each of the Si layers 2 and 3. That is to say, regions in the Si layers 2 and 3 below the pattern defective parts 5a and 6a or the deficiency parts 5b and 6b of the electrode films 5 and 6 are completely removed by the Si etching process. However, the purpose of the present invention is to control the thicknesses of the Si layers 2 and 3 below the pattern defective part 5a and the deficiency part 5b, thus a removal amount of the Si layers 2 and 3 in the Si etching process is not limited to that shown in FIGS. 4 and 5 as long as the thicknesses of the Si layers 2 and 3 are controlled by the Si etching process. That is to say, the Si layers 2 and 3 located immediately below the pattern defective part 5a and the deficiency part 5b of the electrode films 5 and 6 need to be removed at least partially in the Si etching process. For example, as shown in FIG. 6, the etching may be performed onto a part of the Si substrate 1, passing through the Si layers 2 and 3. Alternatively, as shown in FIG. 7, the Si layers 2 and 3 located immediately below the pattern defective part 5a and the deficiency part 5b of the electrode films 5 and 6 may be partially removed. In this case, the effect of the present invention can be obtained with a small amount of etching.

Figure 8:
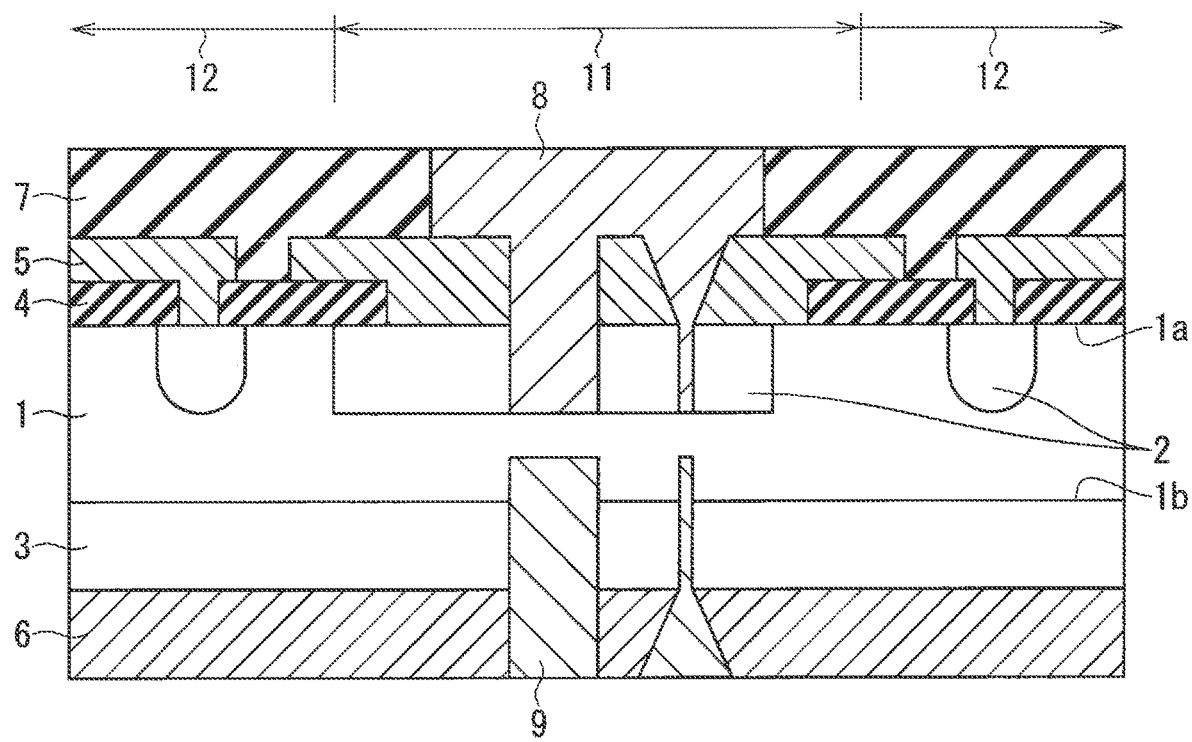
FIG. 8 A cross-sectional view of a semiconductor device according to a modification example of the present invention.
Figure 9:
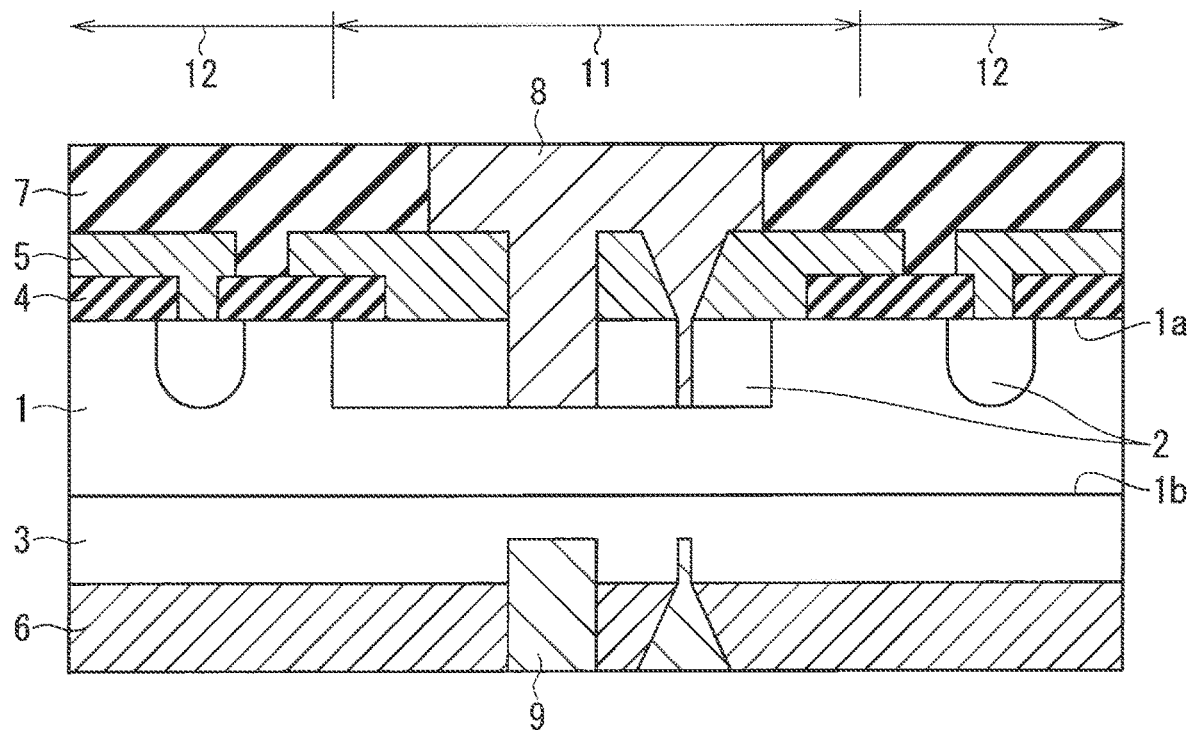
FIG. 9 A cross-sectional view of a semiconductor device according to a modification example of the present invention.

A degree of etching of the Si layers 2 and 3 may be different between the Si layer 2 and the Si layer 3. For example, it is also applicable, as shown in FIG. 8, that the etching amount of the Si layer 3 is equal to the thickness of the Si layer 3, and the etching is performed onto the Si substrate 1, passing through the Si layer 2. It is also applicable, as shown in FIG. 9, that the etching amount of the Si layer 3 is equal to the thickness of the Si layer 3, and the etching is partially performed on the Si layer 2.

Both the Si layer 2 and the Si layer 3 are etched in the Si etching process in the above description. The etching of the Si layer 2 and the Si layer 3 may be performed at the same time or different times.

The etching may be performed on at least one of the Si layer 2 and the Si layer 3.

Described above is the example of application of the present invention to the semiconductor device having the P type Si layer 2 on the side of the first main surface 1a of the Si substrate 1 and the N type Si layer 3 on the side of the second main surface 1b, however, the present invention may be applied to the other semiconductor device. For example, the Si layer on the side of the second main surface 1b of the Si substrate 1 may have a super junction structure in which the N type Si layer 3A and the P type Si layer 2B are alternately arranged as shown in FIG. 10. In FIGS. 4 and 5, the N type Si layer 3 is disposed on the side of the second main surface 1b of the Si substrate 1, however, the P type Si layer may be disposed alternatively.

The example of applying the present invention to the Si semiconductor device is described above, however, the present invention may also be applied to the other semiconductor material. For example, if an SiC substrate is used instead of the Si substrate to foam an SiC layer instead of the Si layer, etching having a high selected ratio with respect to SiC is performed instead of the Si etching process.

As described above, according to the method of manufacturing the semiconductor device shown in Step S11 to Step S16 in FIG. 3, Si etching, which is a first etching having a higher selected ratio with respect to Si, which is a semiconductor material of the Si layer 2, than the material of the electrode film 5, is performed on the semiconductor device having the Si substrate 1 which is the semiconductor substrate, the Si layer 2 which is a first semiconductor layer formed on the side of the first main surface 1a of the Si substrate 1, and the electrode film 5 which is a first electrode film formed on the Si layer 2 to be in contact with the Si layer 2 over the electrode film 5, and a region in the Si layer 2 below the pattern defective part 5a or the deficiency part 5b of the electrode film 5 is removed at least partially to form the electrode film 8 in the pattern defective part 5a or the deficiency part 5b of the electrode film 5. Accordingly, the thickness of the Si layer 2 below the pattern defective part 5a and the deficiency part 5b can be controlled by the Si etching process, thus a test condition such as a current application condition or a voltage application condition can be easily set in the subsequent shipping inspection, and the test can be easily performed.

In the method of manufacturing the semiconductor device of the present invention, Si etching, which is a second etching having a higher selected ratio with respect to Si, which is a semiconductor material of the Si layer which is a second semiconductor layer, than the material of the electrode film 6, is performed over the electrode film 6 which is a second electrode film, and a region in the Si layer 3 below the pattern defective part 6a or the deficiency part 6b of the electrode film 6 is removed at least partially to form the electrode film 9 in the pattern defective part 6a or the deficiency part 6b of the electrode film 6. Accordingly, the thickness of the Si layer 3 below the pattern defective part 6a and the deficiency part 6b can be controlled by the Si etching process, thus a test condition such as a current application condition or a voltage application condition can be easily set in the subsequent shipping inspection, and the test can be easily performed.

According to the present invention, each embodiment can be appropriately varied or omitted within the scope of the invention.

The present invention has been shown and described in detail, the foregoing description is in all aspects illustrative and not restrictive. It is therefore understood that various modifications not exemplified are construed to be made without departing from the scope of the present application.

EXPLANATION OF REFERENCE SIGNS

1 Si substrate, 2, 3 Si layer, 4 oxide film, 5, 6, 8, 9 electrode film, 5a, 6a pattern defective part, 5b, 6a deficiency part, 7 protection film, 11 element region, 12 termination region.

The invention claimed is:

1. A method of manufacturing a semiconductor device, comprising:
performing, on the semiconductor device having a semiconductor substrate, a first semiconductor layer being formed on a side of a first main surface of the semiconductor substrate, a first electrode film being formed on the first semiconductor layer to be in contact with the first semiconductor layer, a second semiconductor layer being formed on a side of a second main surface of the semiconductor substrate opposing the first main surface, and a second electrode film being formed on the second semiconductor layer to be in contact with the second semiconductor layer, a first etching having a higher selected ratio with respect to a semiconductor material of the first semiconductor layer than a material of the first electrode film over the first electrode film;

forming an electrode film over the first electrode film;

performing a second etching having a higher selected ratio with respect to a semiconductor material of the second semiconductor layer than a material of the second electrode film over the second electrode film; and forming an electrode film over the second electrode film.

2. The method of manufacturing the semiconductor device according to claim 1, wherein a region in the first semiconductor layer below a pattern defective part or a deficiency part of the first electrode film is completely removed by the first etching.

3. The method of manufacturing the semiconductor device according to claim 1, wherein a region in the first semiconductor layer below a pattern defective part or a deficiency part of the first electrode film is partially removed by the first etching.

4. The method of manufacturing the semiconductor device according to claim 1, wherein a region in the second semiconductor layer below a pattern defective part or a deficiency part of the second electrode film is completely removed by the second etching.

5. The method of manufacturing the semiconductor device according to claim 1, wherein a region in the second semiconductor layer below a pattern defective part or a deficiency part of the second electrode film is partially removed by the second etching.

6. The method of manufacturing the semiconductor device according to claim 1, wherein the first etching and the second etching are simultaneously performed.

7. The method of manufacturing the semiconductor device according to claim 1, wherein the first etching and the second etching are performed at different times.

8. The method of manufacturing the semiconductor device according to claim 1, wherein the first semiconductor layer has a super junction structure being made up of a semiconductor layer of a first conductivity type and a semiconductor layer of a second conductivity type.

9. The method of manufacturing the semiconductor device according to claim 1, wherein the first semiconductor layer is an Si layer.

10. The method of manufacturing the semiconductor device according to claim 1, wherein the second semiconductor layer is an Si layer.

11. The method of manufacturing the semiconductor device according to claim 1, wherein a region in the first semiconductor layer below a pattern defective part or a deficiency part of the first electrode film is at least partially removed by the first etching.

12. The method of manufacturing the semiconductor device according to claim 1, wherein a region in the second semiconductor layer below a pattern defective part or a deficiency part of the second electrode film is at least partially removed by the second etching.

* * * * *